United States Patent
Radens et al.

(10) Patent No.: US 6,190,979 B1
(45) Date of Patent: Feb. 20, 2001

(54) METHOD FOR FABRICATING DUAL WORKFUNCTION DEVICES ON A SEMICONDUCTOR SUBSTRATE USING COUNTER-DOPING AND GAPFILL

(75) Inventors: Carl Radens, LaGrangeville; Mary E. Weybright, Pleasant Valley, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/351,148

(22) Filed: Jul. 12, 1999

(51) Int. Cl.[7] .......................... H01L 21/22; H01L 21/336
(52) U.S. Cl. .......................... 438/301; 438/555; 438/561; 438/563
(58) Field of Search ................... 438/221, 301, 438/555, 559, 558, 561, 583, 587, 563, 657; 257/548

(56) References Cited

U.S. PATENT DOCUMENTS

| | | | |
|---|---|---|---|
| 3,899,363 | 8/1975 | Dennard et al. | 148/1.5 |
| 4,350,992 | 9/1982 | Tubbs | 357/23 |
| 4,980,303 | * 12/1990 | Yamauchi | 437/31 |
| 5,252,504 | * 10/1993 | Lowery et al. | 437/34 |
| 5,304,503 | 4/1994 | Yoon et al. | 437/43 |
| 5,374,840 | * 12/1994 | Arai | 257/372 |
| 5,451,269 | * 9/1995 | Koyama | 418/33.2 |
| 5,492,857 | 2/1996 | Reedy et al. | 437/63 |
| 5,514,889 | * 5/1996 | Cho et al. | 257/316 |
| 5,545,581 | 8/1996 | Armacost et al. | 437/52 |
| 5,668,035 | 9/1997 | Fang et al. | 438/239 |
| 5,710,073 | 1/1998 | Jeng et al. | 438/239 |
| 5,770,490 | * 6/1998 | Frenette et al. | 438/199 |
| 5,998,266 | * 12/1999 | So | 438/270 |
| 6,103,559 | * 8/2000 | Gardner et al. | 438/183 |

FOREIGN PATENT DOCUMENTS 62-276868 * 12/1987 (JP) ..................... 437/312

OTHER PUBLICATIONS

Japan—Abstract Only—Pub. No. 08–167661 Published Jun. 25, 1996 Inventor: Izawa Tetsuo—Semiconductor Memory Integrated Circuit (Dialog Access #05212161).

* cited by examiner

Primary Examiner—Olik Chaudhuri
Assistant Examiner—Shrinivas H. Rao
(74) Attorney, Agent, or Firm—Daryl K. Neff; Cantor Colburn LLP

(57) ABSTRACT

A method for counter-doping gate stack conductors on a semiconductor substrate, which substrate is provided with narrow space array regions (i.e., memory device regions) having a plurality of capped gate stack conductors spaced a first distance apart, and wide space array regions (i.e., logic device regions) having a plurality of gate stack conductors spaced a second distance apart, wherein the first distance is narrow in relation to the second distance. The method comprises depositing a conformal dopant source so as to provide gap fill between gate stack conductors in the narrow space array regions and under fill between gate stack conductors in the wide space array regions; etching so that the conformal dopant source is removed from the wide space array regions and remains at least in part between the gate stack conductors in the narrow space array regions; and counter-doping gate stack conductors in the narrow space array regions by lateral diffusion of dopant from conformal dopant source through narrow space array gate stack conductor sidewalls.

22 Claims, 2 Drawing Sheets

FIGURE 7

PROCESS FLOW:

Shallow trench isolation (STI) and well fabrication

Gate oxidation

Gate poly deposition p-type (in situ doped or I/I)

Gate silicide deposition (growth)

Gate cap dielectric deposition

Gate lithography and reactive ion etching

Conformal doping film deposition (CVD PSG)

Etchback of doping film from wide space area

Cap oxide deposition

Drive-in anneal

Dope source/drain regions in wide space array region

Strip cap oxide and doping film

Source/drain litho + I/I in narrow space array region

Gate spacer formation etc. . . .

METHOD FOR FABRICATING DUAL WORKFUNCTION DEVICES ON A SEMICONDUCTOR SUBSTRATE USING COUNTER-DOPING AND GAPFILL

BACKGROUND OF THE INVENTION

The present invention relates to the fabrication of integrated circuits on semiconductor substrates. More specifically, the present invention relates to a method for fabricating a combination of memory devices and logic devices on the same semiconductor substrate.

As greater and greater numbers of devices and circuits become possible on semiconductor integrated circuits, the desire to integrate more system function onto a single chip grows as well. Logic circuits process, while memory circuits store, information, and the two are used in tandem to add "intelligence" to electronic products. The two functions have been provided on separate chips, adding complexity and cost to the final product. There is an increasing need to join both memory and logic circuits together on the same chip.

With the advent of Large Scale Integration (LSI) many of the integrated circuits formed on semiconductor substrates are comprised of several circuit functions on a single chip. For example, dynamic random access memory (DRAM), nonvolatile memory (NVM), and similar memory devices are composed of an array of memory cells for storing digital information, while the peripheral circuits on these devices are typically composed of logic circuits for addressing the memory cells, with other peripheral circuits functioning as read/write buffers and sense amplifiers.

The field effect transistor (FET) of a semiconductor integrated circuit controls current conduction from a source region to a drain region by application of voltage to a gate conductor. If the gate conductor is insulated from the source-drain conduction channel, the device is called an insulated gate FET. The most common gate structure is that of metal oxide semiconductor (MOSFET).

Dopant atoms are introduced into MOSFETs for specific purposes such as to control threshold voltage, dope gate conductors, or to control substrate currents, with adverse side effects accepted as necessary by-products of dopant atom introduction.

The technology for dynamic random access memory (DRAM) circuits is optimized for density and low cost while the technology for logic circuits is optimized for speed. The requirement for dual work function (i.e., logic and memory) places additional problems of complexity and cost on the fabrication process. Memory circuits achieve density requirements with self-aligned contacts, which are easily implemented in a process having a single type (typically n-type) gate work function. A buried-channel p-type MOSFET is used in DRAM since it allows a single work function gate conductor (n-type) to be employed throughout the technology. This results in cost savings in DRAM, at the expense of an inferior performing p-type MOSFET. P- and n-gate conductor devices are highly desirable for merged logic dram (MLD) products. The fabrication of dual work function n-type and p-type gate conductors comprising CMOS devices necessitates a number of complex photoresist and masking steps which increase cost and decrease yield.

A prior art method for obtaining memory arrays with high density and borderless bitline contacts (borderless to adjacent gate conductor) involves using a gate cap of nitride on top of the polysilicon or composite polysilicon/silicide gate stack conductor. The nitride caps are required in narrow space array memory areas to provide protection against bitline-to-gate conductor shorts. In the prior art method for logic circuits, there is no nitride cap, and each polysilicon gate type may be created by ion implanting from above with the appropriate material. However, use of a nitride cap in the logic circuit preparation would block off the ion implantation and frustrate the necessary doping operation. Problematically, a cap is needed on narrow space array memory gates due to memory device density. There is thus a dual requirement to provide a gate cap on narrow space array gate stacks and to dope each polysilicon gate type.

U.S. Pat. No. 5,668,035 discloses a method for fabricating a dual-gate oxide for memory having embedded logic by forming gate electrodes having thin gate oxide in the logic device areas (peripheral areas) and a thicker gate oxide in the memory cell device areas. The method for dual gate oxide thickness is disclosed as being also applicable to complimentary metal oxide semiconductor (CMOS) circuits where both p-doped and n-doped wells are provided for making p- and n-channel FETs.

U.S. Pat. No. 5,710,073 discloses a method for forming a local interconnect structure using a configuration of spacers and etch barriers (silicon nitride cap layers) to form self-aligned source and drain contacts. The as disclosed process (1) forms isolation caps having anti-reflective properties on the tops of the gate electrodes and on top of first level interconnects; (2) uses highly selective silicon nitride etches for defining the isolation caps; and (3) forms self-aligned first and second level substrate contacts using isolation spacers on the gate electrodes and on the first level insulation layer.

U.S. Pat. No. 5,545,581 discloses a method for forming a plug trench strap by formation of strap holes exposing the electrical elements utilizing an oxide insulation layer, a nitride etch stop, a highly selective oxide nitride etch, and a selective nitride oxide etch.

U.S. Pat. No. 5,492,857 discloses a silicon on sapphire CMOS device for wireless communication.

U.S. Pat. No. 4,350,992 discloses an n-channel MOS or ROM structure. In an array of rows and columns of the cells in accordance with U.S. Pat. No. 4,350,992, the row address lines and gates are polysilicon, and column lines forming output and ground are defined by elongated N+ regions which are partly diffused and partly implanted since the column lines cross beneath the polysilicon row address strips. Each potential MOS transistor in the array is programed to be a logic "1" or "0" by the presence or absence of a moat beneath the gate of a cell.

U.S. Pat. No. 3,899,363 discloses a silicon semiconductor FET utilizing ion implantation to reduce sidewall conduction. The method for reducing the subthreshold sidewall conduction between the source and drain of a FET which is surrounded by recessed oxide comprises the step of doping by ion implantation at least the channel region of said FET at the interface of said channel region with said surrounding recessed oxide to increase the threshold at the edges of said channel region in the vicinity of said recessed oxide.

U.S. Pat. No. 5,304,503 discloses an EPROM (erasable programmable read only memory) cell with a tungsten gate. A process flow is disclosed for fabricating a self-aligned stacked gate EPROM cell that uses a chemical vapor deposition tantalum oxide film to replace conventional oxide-nitride-oxide as a control gate dielectric. The dielectric deposition and cell definition steps of the process flow are performed in a backend module, minimizing high temperature exposure of the tantalum oxide film.

None of the references discussed above describe the formation of dual work function devices without the need for additional masking levels. There thus remains a need for an improved method to provide a memory logic device product having a combination of n-type and p-type gate stack conductors on the same chip including a gate cap which is required for a diffusion conduct which is borderless or self-aligned to the gate conductor. There further remains a need for a method for forming a combination of n-type and p-type gate conductors on the same chip while minimizing the number of photoresist masking operations.

SUMMARY OF THE INVENTION

The above-discussed and other drawbacks and deficiencies of the prior art are overcome or alleviated by the present method for counter-doping narrow space array gate stack conductors on a semiconductor substrate, the substrate comprising densely packed narrow space array regions (i.e., memory device regions) comprising a plurality of capped gate stack conductors and less densely packed wide space array regions (i.e., logic device regions) comprising a plurality of gate stack conductors. The method comprises depositing a conformal dopant so as to provide gap fill between gate stack conductors in the narrow space array regions and under fill between gate stack conductors in the wide space array regions; etching so that the conformal dopant is removed from the wide space array regions; and counter-doping gate stacks in the narrow space array regions by lateral diffusion of the dopant through the narrow space array gate stack conductor sidewalls.

BRIEF DESCRIPTION OF THE DRAWINGS

Referring now to the drawings wherein like elements are numbered alike in the several FIGURES:

FIG. 7 is table depicting a process flow in accordance with an embodiment of the present method.

DESCRIPTION OF THE PREFERRED EMBODIMENT

The present invention discloses a method for counter-doping narrow space array gate stack conductors on a semiconductor substrate, said substrate provided with narrow space array regions (i.e., memory device regions) comprising a plurality of densely packed capped gate stack conductors, and wide space array regions (i.e., logic device regions) comprising a plurality of less densely packed gate stack conductors. The method comprises depositing a conformal thin-film doping source so as to provide gap fill between gate stack conductors in the narrow space array regions and under fill between gate stack conductors in the wide space array regions; etching so that the conformal dopant film is removed from the wide space array regions; and counter-doping gate stack conductors in the narrow space array regions by lateral diffusion of the dopant through narrow space array gate stack conductor sidewalls.

In another embodiment, the conformal dopant serves as a mask for the source and drain regions in the narrow space array regions enabling maskless doping of source and drain regions in the wide space array regions only using ion implantation or diffusion processes.

The present invention using the gap fill property of a conformal doping source to differentiate between at-pitch narrow space array regions and wide space support regions of the circuit will be described in detail with reference to the accompanying drawings. As used herein, etching refers to chemically removing a material. Silicon semiconductor substrates suitable for use in the present method include polysilicon (polycrystalline silicon), amorphous (non-crystalline) silicon, monocrystalline silicon, silicon/germanium materials, and silicon on insulator. CVD refers to chemical vapor deposition. Ion implantation refers to the implantation of ions, for example, for doping a semiconductor substrate. Salicidation means formation of self-aligned silicide.

Figure 1:
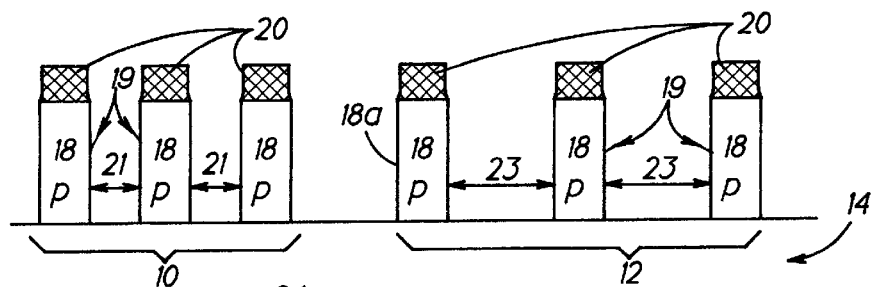
FIG. 1 is a cross-sectional view of a portion of a semiconductor substrate patterned with narrow space array memory regions and wide space array logic regions.

Referring now to FIG. 1, a cross-sectional view of a portion of a patterned semiconductor substrate 14 is shown, depicting gate stack conductors 18 having sidewalls 19 in narrow space array memory device regions 10 and wide space array logic device regions 12. The gate stack conductors 18 in the narrow space array regions 10 are spaced a first distance 21 apart and the gate stack conductors 18 in the wide space array regions 12 are spaced a second distance 23 apart, wherein the first distance 21 is narrow in relation to the second distance 23, providing densely packed memory regions and less densely packed logic regions 12. The combined vertical extent of conductor 18 and cap insulator 20 to first distance 21 between adjacent gate stack conductors in the narrow space array memory regions 10 define an aspect ratio of greater than about 1:1, preferably greater than about 2:1, most preferably greater than about 3:1.

FIG. 7 provides a process flow which sets forth steps in accordance with one embodiment of the present process, along with selected patterning steps occurring before and after the present process. The process flow comprises the patterning steps of shallow trench isolation and well fabrication, gate oxidation to provide a gate oxide layer on the semiconductor substrate, gate polysilicon deposition (in situ doped or ion implanted to yield blanket p-type gates in the embodiment shown), gate silicide deposition, gate lithography and reactive ion etching, according to methods known in the art.

The process flow continues with steps according to an embodiment of the present method which employs deposition of conformal doping source, such as conformal doping film deposition (e.g., chemical vapor deposition of phosphosilicate glass), etchback of conformal dopant from wide space array regions, using, for example, hydrofluoric acid-containing solution, cap oxide deposition, drive-in annealing to drive the impurity dopant from the conformal doping source into the narrow space array gate stacks through the gate stack sidewalls, and selective doping of source and drain regions in wide space array regions by use of conformal dopant to mask sources and drains in narrow space array regions and enable ion implantation into wide space array regions.

The cap oxide and conformal dopant are then removed, followed by source and drain lithography, ion implantation, gate space formation, as desired, according to known bulk fabrication methods.

In the embodiment shown in FIG. 1, a blanket layer of p-type gate polysilicon and a blanket layer of silicon nitride gate cap have been deposited and patterned to form gate stack conductors 18 in narrow space array regions 10 and wide space array regions 12. The gate polysilicon can be doped in situ by chemical vapor deposition or by blanket ion implantation with the desired dopant ions.

It is within the scope of the present invention to alter this configuration so as to begin with a blanket layer of n-type polysilicon followed by counter-doping the n-type gate stack conductors with a p-type dopant (such as boron-doped phosphosilicate glass) to yield a p-type FET. However, the higher solubility of n-type dopants compared to p-type dopants renders it easier to convert p-type polysilicon to n-type polysilicon than to do the reverse.

Prior to the formation shown in FIG. 1, well fabrication and device isolation, such as a shallow trench isolation process, has been accomplished (unshown) to form wells in which to form source and drain regions. As shown in FIG. 1, a blanket polysilicon layer, gate silicide (not shown), and nitride cap layer have been patterned to make interconnections (not shown) and gate stack conductors 18 in accordance with methods known in the art. FIG. 1 shows an embodiment wherein the gate cap layer 20 has been provided on gate stack conductors 18 in both narrow space array regions 10 and wide space array 12 regions. Alternatively, deposition of the gate cap layer may be limited to the gate stack conductors comprising the narrow space array regions 10.

Figure 2:
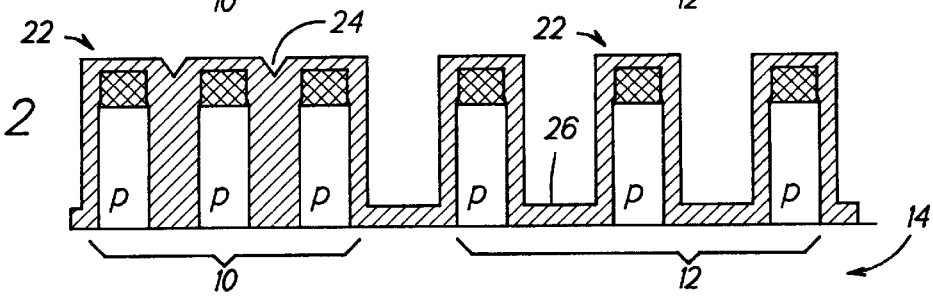
FIG. 2 is a cross-sectional view of a portion of a patterned semiconductor substrate after deposition of conformal dopant film depicting gap fill between adjacent gate stack conductors in narrow space array regions and under fill between adjacent gate stack conductors in wide space array regions.

In FIG. 2, a conformal film doping source (conformal dopant) 22, such as phosphosilicate glass, is deposited over the gate stack conductors 18 of the narrow space array regions 10 and the wide space array regions 12, such as by chemical vapor deposition. While the conformal dopant may be a conformal thin film doping source as discussed herein, skilled artisans will readily recognize other suitable doping sources, and such doping sources are within the scope of the present invention.

The conformal doping film thickness and differential gate stack array densities provide gap fill 24 in narrow space array regions 10 and under fill 26 in wide space array regions 12. The conformal film dopant may be any conformal dopant known in the art that will provide at least some amount of conformality to achieve gap fill in densely filled narrow space array regions 10 and under fill in more widely spaced wide space array regions 12. Preferably, the narrow space array regions 10 are at minimum pitch; that is, the distance between adjacent gate stack conductors in narrow space array regions 10 are as small as they can be so as to form the densest region on the memory chip. In this way, the space between devices can be exploited to differentiate between device work function type (memory or logic), and narrow space array regions 10 can be counter-doped through use of conformal dopant gap fill 24 and remaining conformal doping film 25 (after etchback). Gate stack conductor pattern density in the narrow space array regions is preferably about 40% to about 60%. In contrast, gate stack conductor density in the wide space array regions is typically about 5% to about 30%.

Figure 3:
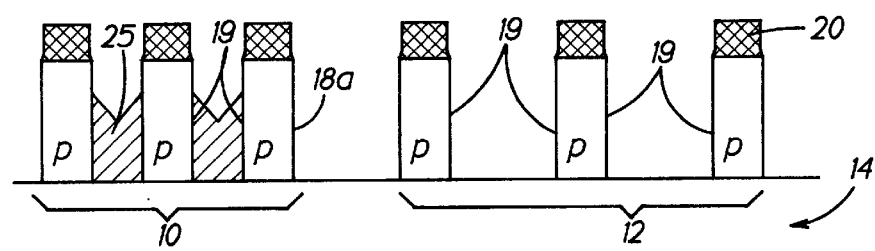
FIG. 3 is a cross-sectional view of a portion of a patterned semiconductor substrate after etching depicting conformal dopant remaining between gate stack conductors in narrow space array regions.

Conformal dopant 22 is next removed from the wide space array regions 12 and at least partially remains in the narrow space array regions 10 (as shown in FIG. 3). An isotropic dry or wet etch process, using a solution such as a hydrofluoric acid-containing solution, may be employed to etch the conformal dopant film 22 at the same rate in the horizontal and vertical directions. With this approach, the amount of etching required to remove the under fill 26 in the wide space array regions 12 would not completely remove the larger quantity of conformal dopant comprising the gap fill 24, thus leaving remaining conformal dopant 25 in the narrow space array regions 10. Alternatively, a two-step process may be used wherein an anisotropic etch is employed, followed by an isotropic etch to remove any remaining conformal dopant from the sidewalls 19 of the wide space array 12 logic gate stacks.

Following the deposition of thin oxide film 27 to prevent the auto-doping of wide space array region 12, the wafer is annealed to drive the impurity dopants from remaining conformal doping film 25 through the gate sidewalls 19 in narrow space array region 10.

The narrow space array areas 10 with remaining conformal dopant 25 will become counter-doped to form n-type polysilicon gates 18, while the gate stack conductors 18 in the wide space array regions 12 remain p-type. The gate polysilicon comprising gate stack conductors 18 absorbs the n-dopant through sidewalls 19. Because the dopant diffusivity in polysilicon is about one hundred times larger than the diffusivity in single crystal silicon, n-type doping will be readily distributed throughout the narrow space array region 10 gate stack conductor polysilicon.

Figure 4:
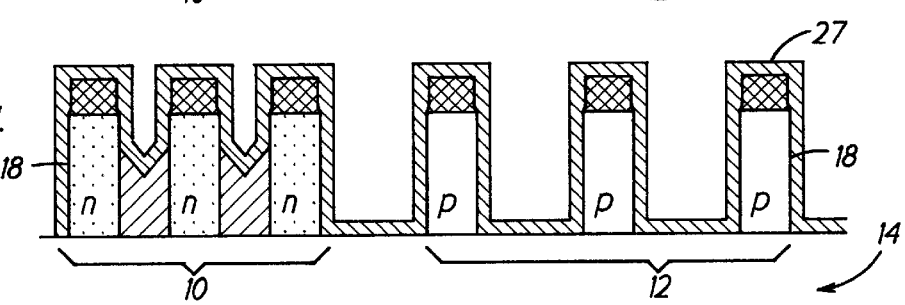
FIG. 4 is a cross-sectional view of a portion of a patterned semiconductor substrate depicting counter-doped gate stack conductors in the narrow space array regions after annealing.

As discussed above, a thin layer of cap oxide 27 is deposited and a thermal cycle is employed to electrically activate the dopant, improve diffusion uniformity and drive in the dopant from the doping source, thereby further counter-doping the p-type polysilicon gate, yielding an n-type polysilicon gate in the narrow space array regions 10. FIG. 4 shows the narrow space array 10 gate stack conductors 18 counter-doped after the annealing heating cycle.

Figure 5:
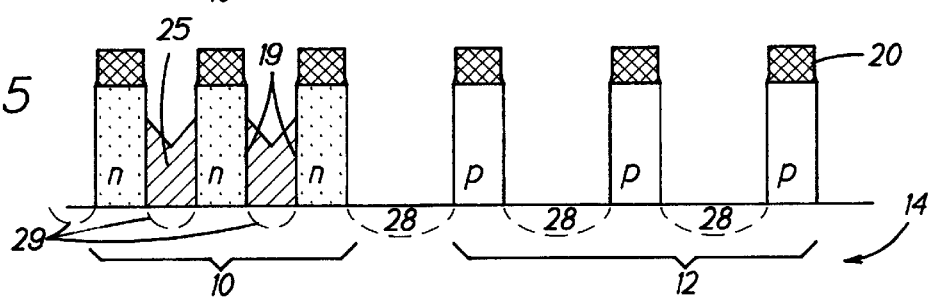
FIG. 5 is a cross-sectional view of a portion of a patterned semiconductor substrate depicting masking by the conformal dopant film of the narrow space array regions and doping of the diffusion regions in the wide space array regions.

As shown in FIG. 5, the source and drain (diffusion) regions 29 in the narrow space array regions 10 are masked by the remaining conformal dopant 25. The present invention provides the advantage of obviating the need for an additional masking layer for selectively doping the diffusion regions 28 in the wide space array regions 12 and not the diffusion regions 29 in the narrow space array regions 10 using ion implantation. This reduces the number of masking steps required and thus reduces total fabrication cost.

Figure 6:
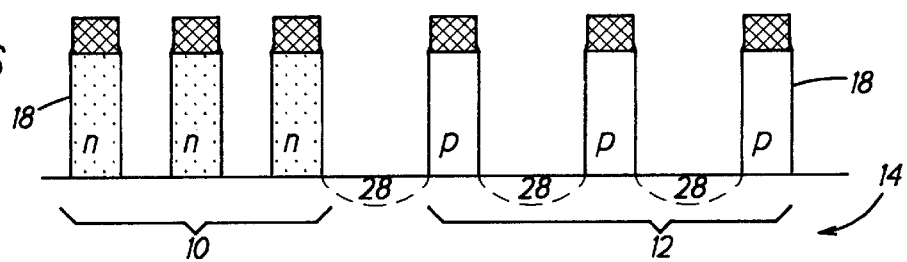
FIG. 6 is a cross-sectional view of a portion of a patterned semiconductor substrate depicting n-type gate stack conductors of the narrow space array regions and p-type gate stack conductors of the wide space array regions after removal of the conformal dopant film.

FIG. 6 shows the cross-section of FIG. 5 after stripping the remaining conformal dopant 25, yielding narrow space array regions 10 comprising n-type gate conductors and wide space array regions 12 comprising p-type gate conductors 18. After removing the remaining conformal dopant 25 and gate sidewall oxide 27, nitride gate sidewall spacers may be formed (not shown), and photoresist patterned for source and drain implants, repeatedly, as desired, and insulating layers and metal layers may be deposited and patterned for interconnecting devices.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method for selectively counter-doping gate stack conductors on a semiconductor substrate, said method comprising the steps of:

providing a substrate comprising narrow space array regions and wide space array regions, said wide and narrow space array regions comprising a plurality of gate stack conductors, and wherein said gate stack conductors in said narrow space array regions are more densely packed than in said wide space array regions;

depositing a conformal dopant source on the gate stack conductors so as to provide gap fill between gate stack conductors in the narrow space array regions and under fill between gate stack conductors in the wide space array regions;

etching so that the conformal dopant source is removed from the wide space array regions and so that at least a portion of conformal dopant source remains between gate stack conductors in the narrow space array regions;

counter-doping gate stack conductors in the narrow space array regions by lateral diffusion of dopant from the conformal dopant source through narrow space array gate stack conductor sidewalls.

2. The method of claim 1, wherein the depositing is by chemical vapor deposition.

3. The method of claim 1, wherein the gate stack conductors comprise p-type polysilicon and the conformal dopant source comprises n-type dopant.

4. The method of claim 3, wherein the n-type dopant is selected from the group consisting of phosphosilicate glass and arsenic-doped glass.

5. The method of claim 1, wherein the gate stack conductors comprise n-type polysilicon and the conformal dopant source comprises p-type dopant.

6. The method of claim 5, wherein the p-type dopant is selected from the group consisting of boron and boron-doped phosphosilicate glass.

7. The method of claim 1, wherein a gate cap is disposed on the gate stack conductors in the narrow space array regions and on the gate stack conductors in the wide space array regions.

8. The method of claim 7, wherein the gate cap is selected from the group consisting of silicon nitride, tetraethoxysilane, boron silicate glass, phosphorous silicate glass, and silicon oxynitride.

9. The method of claim 1, where in the narrow space array regions are at a pitch sufficiently small so as to provide a conductor pattern density of no less than about 40%.

10. The method of claim 1, wherein the gate stack conductor density in the narrow space array regions is about 40% to about 60%.

11. The method of claim 1, wherein the gate stack conductor density in the wide space array regions is about 5% to about 30%.

12. The method of claim 1, wherein the etching is selected from the group consisting of chemical mechanical polishing, reactive ion etching, dry etching, plasma etching, wet etching, isotropic etching, anisotropic etching, or a combination thereof.

13. The method of claim 1, wherein the etching is anisotropic etching.

14. The method of claim 13, wherein the etching is reactive ion etching.

15. The method of claim 1, further comprising:

heating to facilitate lateral diffusion of the dopant through narrow space array gate stack conductor sidewalls.

16. The method of claim 1, further comprising:

doping open source and drain regions in the wide space array regions, wherein remaining conformal dopant masks source and drain regions in the narrow space array regions.

17. The method of claim 16, wherein the doping is by ion implantation.

18. The method of claim 15, further comprising:

doping open source and drain regions in the wide space array regions, wherein remaining conformal dopant masks source and drain regions in the narrow space array regions.

19. The method of claim 18, wherein the doping is by ion implantation.

20. The method of claim 1, wherein the narrow space array memory regions have an aspect ratio of greater than about 1:1, wherein said aspect ratio is defined by a vertical extent of the capped gate stack conductor to a first distance defining a space between adjacent narrow space array gate stack conductors.

21. The method of claim 20, wherein the narrow space array aspect ratio is greater than about 2:1.

22. The method of claim 21, wherein the narrow space array aspect ratio is greater than about 3:1.

* * * * *